(12) United States Patent  
Kucharski et al.

(10) Patent No.: US 10,714,852 B2  
(45) Date of Patent: Jul. 14, 2020

(54) PRINTED CIRCUIT BOARD MOUNTED CONTACTORS

(71) Applicant: Hamilton Sundstrand Corporation, Charlotte, NC (US)

(72) Inventors: David M. Kucharski, Delavan, WI (US); John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/842,734

(22) Filed: Dec. 14, 2017

(65) Prior Publication Data

US 2019/0190175 A1    Jun. 20, 2019

(51) Int. Cl.
| | |
|---|---|
| *H01R 12/71* | (2011.01) |
| *H01H 1/58* | (2006.01) |
| *H01H 50/54* | (2006.01) |
| *H01H 1/22* | (2006.01) |
| *H01H 51/27* | (2006.01) |
| *H01R 13/629* | (2006.01) |
| *H05K 1/11* | (2006.01) |
| *H01H 51/01* | (2006.01) |

(52) U.S. Cl.
CPC ............ *H01R 12/718* (2013.01); *H01H 1/22* (2013.01); *H01H 1/5805* (2013.01); *H01H 50/546* (2013.01); *H01H 51/27* (2013.01); *H01R 13/62966* (2013.01); *H05K 1/11* (2013.01); *H01H 51/01* (2013.01)

(58) Field of Classification Search
CPC ... H01R 12/718; H01R 13/62966; H05K 1/11
USPC ....... 361/727, 736, 741, 754, 756, 798, 819, 361/823, 828, 832, 837
See application file for complete search history.

(56) References Cited

U.S. PATENT DOCUMENTS

| | | | |
|---|---|---|---|
| 4,303,815 A | * | 12/1981 | Ishikawa ................ H01H 3/12 200/330 |
| 6,424,243 B1 | | 7/2002 | Forster |
| 6,794,968 B2 | | 9/2004 | Arnholt |
| 8,031,486 B2 | | 10/2011 | Wavering et al. |
| 8,552,824 B1 | | 10/2013 | Pal |

* cited by examiner

*Primary Examiner* — James Wu  
*Assistant Examiner* — Hung Q Dang  
(74) *Attorney, Agent, or Firm* — Locke Lord LLP; Scott D. Wofsy; Georgi Korobanov

(57) ABSTRACT

A printed circuit board (PCB)-mounted contactor including a PCB with planar surface, source and load terminals fixed to the PCB, and a contact. The contact is supported by the PCB and is movable between open and closed positions. Movement of the contact is parallel to the planar surface. Electrical assemblies having PCB-mounted contactors and methods of controlling current flow in electrical systems with PCB-mounted contactors are also described.

20 Claims, 7 Drawing Sheets

PRINTED CIRCUIT BOARD MOUNTED CONTACTORS

BACKGROUND OF THE INVENTION

1. Field of the Invention

The present disclosure relates to electrical systems, and more particularly to printed circuit board-mounted contactors for controlling current flow in electrical systems.

2. Description of Related Art

Electrical systems, such as on aircraft, commonly employ contactors to control current flow. Contactors generally switch between an on-state and an off-state by movement of a switch element. In the off-state the switch element assumes a position that prevents current flow through the contactor. To switch to the on-state the switch elements moves to a position that allows the current to flow through the contactor. The movement envelope of switch element and associated drive elements influence the height of the contactor, which can be several inches.

The size of the contactor imposes requirements on the packaging of the contactor. For example, in contactors surface mounted to an underlying printed-circuit board (PCB) the height of housing can interfere with the installation envelop of the other components, potentially constraining the number and arrangement of electrical components in an electrical assembly like a card rack. Mounting sockets, which can be necessary to provide connectivity between the contactor and PCB, can increase the height of the contactor and impose further packaging constraints. For that reasons some contactors are discretely mounted within the electrical assembly with a wiring harness to interface the contactor with the electrical system.

Such conventional systems and methods for mounting contactors have generally been considered satisfactory for their intended purpose. However, there is still a need in the art for improved PCB-mounted contactors, electrical assemblies, and methods of controlling current flow in electrical systems. The present disclosure provides a solution for this need.

SUMMARY OF THE INVENTION

A printed circuit board (PCB)-mounted contactor including a PCB with planar surface, source and load terminals fixed to the PCB, and a contact. The contact is supported by the PCB and is movable between open and closed positions. Movement of the contact is parallel to the planar surface.

In certain embodiments the open and closed positions can be arranged along a movement axis that is parallel to limit volume occupied by the PCB-mounted contactor in an electrical assembly. The PCB can be substantially planar. The movement axis can be parallel to the planar PCB. The supply terminal and the load terminal can be arranged on a common end of the PCB. A stop terminal can be arranged on the PCB between the supply terminal and the load terminal. An inserter/extractor can be arranged on an end of the PCB opposite the supply terminal and the load terminal. An actuator can be supported by the PCB and operably connected to the contact. The PCB can define an actuator aperture. The actuator aperture can extend between opposite surfaces of the PCB. The open and closed positions can be located in the actuator aperture.

In accordance with certain embodiments, the movement axis can be parallel to a longitudinal axis of the PCB. A linear actuator can be supported by the PCB for moving the contact between the open and closed position along the movement axis. The linear actuator can include a solenoid with a coil and a plunger. The coil can be fixed relative to the PCB. The plunger can be fixed relative to the contact and can extend through the coil. It is contemplated that the solenoid can be a first solenoid and the linear actuator can include one or more second solenoids supported by the PCB and operably connected to the contact.

It is also contemplated that, in accordance with certain embodiments, the actuator can include a pivot actuator. The movement axis can be orthogonal or oblique relative to a longitudinal axis of the PCB. The pivot actuator can include a coil, a core, and a permanent magnet. The coil can be fixed relative to the PCB. The core can extend through the coil. The core can be fixed to the PCB. The permanent magnet fixed to the contact at a location disposed between opposite ends of the contact. A pivot can support an end of the contact. The pivot can electrically connect the contact to the load terminal or the supply terminal. The PCB can include a wiring trace electrically connecting the pivot to the load terminal or the supply terminal.

An electrical assembly includes a chassis having a first PCB slot and one or more adjacent second PCB slots. A PCB-mounted contactor as described above is seated in the first PCB slot such that PCB-mounted contactor does not overlap the one or more second PCB slot. In certain embodiments the PCB can define an actuator aperture extending between opposite surfaces of the PCB bodies, the open and positions of the contact being within the actuator aperture. A linear actuator can be arranged with the actuator aperture and operably connected to the contact for moving the contact between the open and closed positions.

In accordance with certain embodiments, a pivot actuator can be supported by the PCB and operably connected to the contact. The pivot actuator can include a coil fixed relative to the PCB, a core extending through the coil and fixed to the PCB, a permanent magnet fixed to the contact between opposite pivot and free ends of the contact, and pivot connected the pivot end of the contact and electrically connected to the contact or load terminal. A pulse actuation circuit can be electrically connected to the pivot actuator.

A method of controlling current flow in an electrical system including a PCB-mounted contactor as described above includes applying an actuation current to the PCB-mounted contactor and moving the contact between the open position and the closed position in a movement that is parallel with the surface of the PCB to which the contactor is mounted. In certain embodiments moving the contact between the open and closed positions can include pivoting the contact in a pivot movement between the open and closed positions such that a free end of the contact traverses the movement axis. The contact can thereafter be magnetically latched in position. In accordance with certain embodiments moving the contact between the open and closed positions can include linearly displacing the contact between the open and closed positions such that contact traverses the movement axis.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make figures, wherein.

DETAILED DESCRIPTION OF THE PREFERRED EMBODIMENTS

Figure 1:
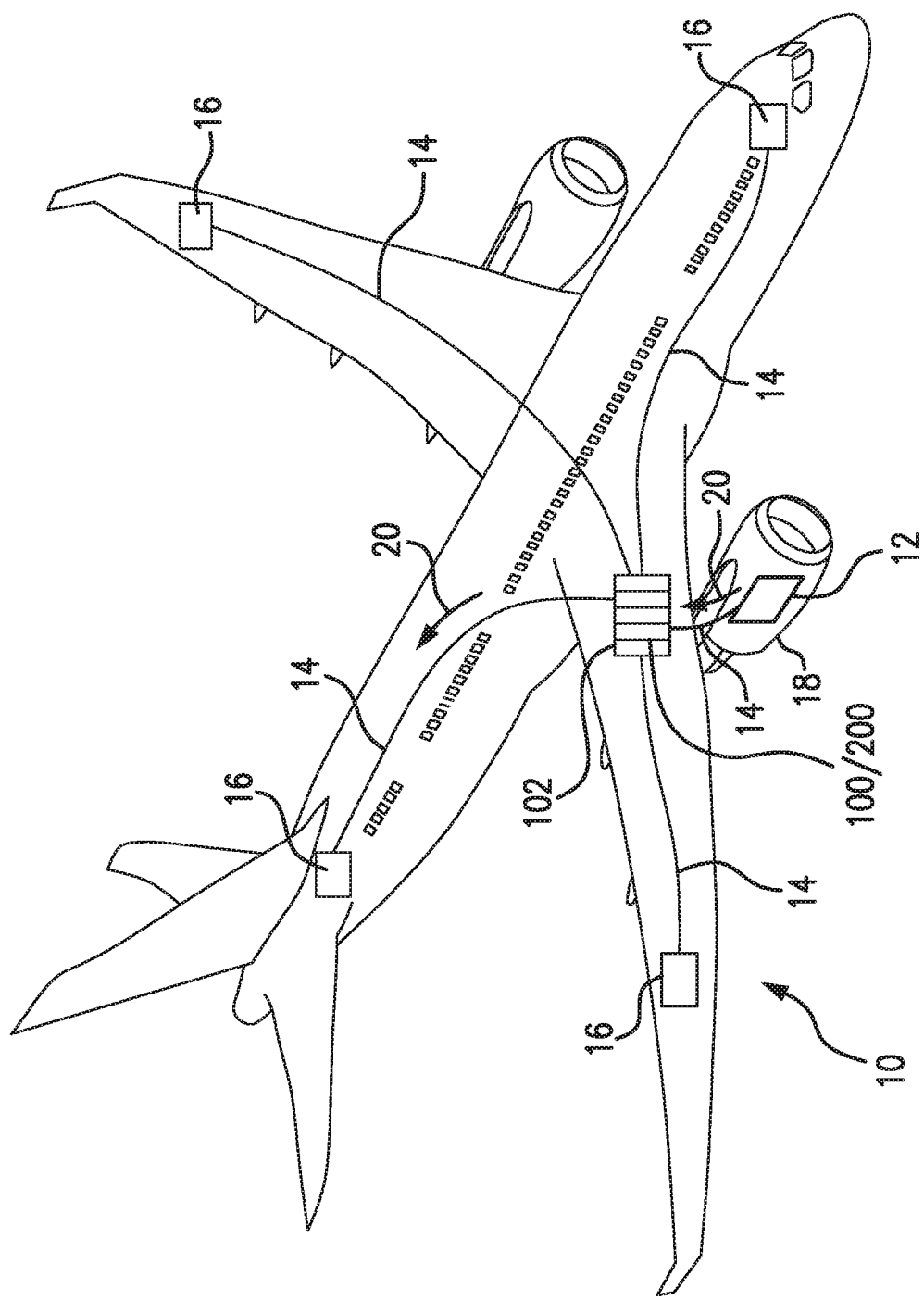
FIG. 1 is a schematic view of an exemplary embodiment of an electrical system in accordance with the present disclosure, showing a printed circuit board (PCB)-mounted contactor seated in an electrical assembly.

Reference will now be made to the drawings wherein like reference numerals identify similar structural features or aspects of the subject disclosure. For purposes of explanation and illustration, and not limitation, a partial view of an exemplary embodiment of a printed circuit board (PCB)-mounted contactor in accordance with the disclosure is shown in FIG. 1 and is designated generally by reference character 100/200. Other embodiments of PCB-mounted contactors, electrical assemblies including PCB-mounted contactors, and methods of actuating PCB-mounted contactors in accordance with the disclosure, or aspects thereof, are provided in FIGS. 2-9 as will be described. The systems and methods described herein can be used controlling current flow in power distribution panels, such as in aircraft electrical systems, though the present disclosure is not limited to power distribution panels or to aircraft electrical systems in general.

Referring to FIG. 1, an electrical system 10, e.g., an aircraft electrical system, is shown. Electrical system 10 includes a generator 12, a power bus 14, and a plurality of power-consuming devices 16. Generator 12 is operably connected to an engine 18, e.g., an aircraft main engine or auxiliary power unit, and is arranged to provide a flow of current 20 to power bus 14. Power bus 14 is connected to respective power-consuming devices 16 by one or more PCB-mounted contactor 100/200. PCB-mounted contactor 100/200 is seated within an electrical assembly 102, which in the illustrated exemplary embodiment is a card rack in a power distribution panel. Although an aircraft electrical system is shown in the illustrated exemplary embodiment, it is to be understood and appreciated that electrical systems in other types of vehicles as well as non-vehicular applications can also benefit from the present disclosure.

Figure 2:
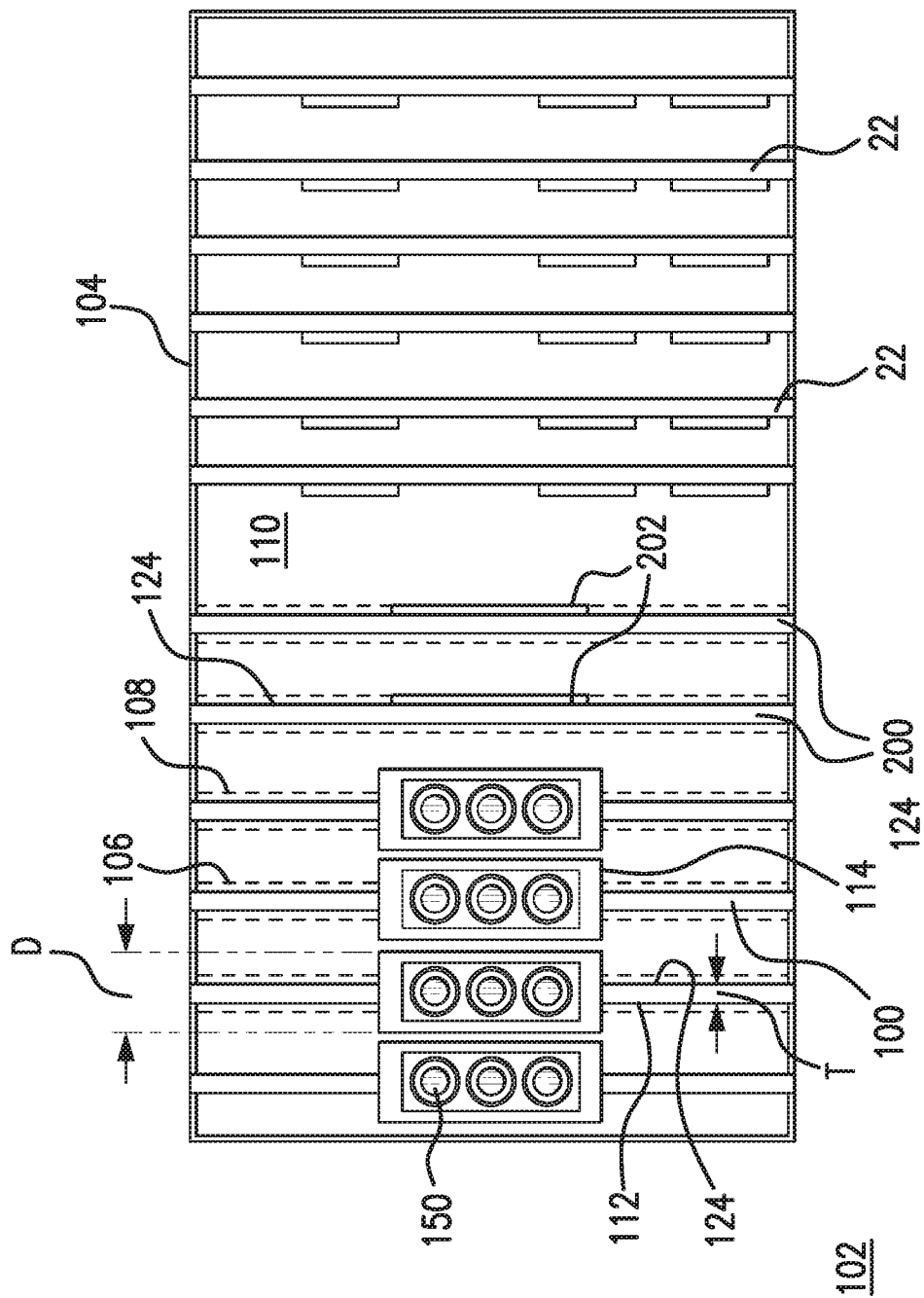
FIG. 2 an elevation view of the electrical assembly of FIG. 1, showing PCB-mounted contactor seated in a card cabinet such that the contactor profile does not overlap adjacent slots within the card cabinet.

With reference to FIG. 2, electrical assembly 102 is shown. Electrical assembly 102 includes a chassis 104 with a plurality of PCB slots, e.g., a first PCB slot 106 and a second PCB slot 108, that are each configured for seating PCB-mounted contactor 100. The PCB slots are defined within a card cage 110, card cage 110 being electrically connected to both generator 12 (shown in FIG. 1), for receiving current 20 (shown in FIG. 1) therefrom, and to power-consuming devices 16 (shown in FIG. 1), for selectively applying power thereto.

As will be appreciated by those of skill in the art in view of the present disclosure, traditional contactors, and in particular those for high current applications, e.g., at current levels greater than about 50 amps, generally extend several inches in height from the surface of the PCB. In some applications contactors require a mount (or socket) to interface wiring traces on a PCB with the contactor, adding to the height of the contactor. Since PCB slots in card cages are generally smaller than the height of such contactors, seating a PCB with a surface-mounted contactor can interfere with the space required to seat a PCB in an adjacent PCB slot. This reduces the number of PCBs that can otherwise be seated in the card cage, increasing the number of card cages required in the electrical system and/or limiting the ability to add circuits in an existing electrical system by adding PCB mounting contactors to card cages already in the electrical system.

To avoid interfering with adjacent PCB slots, electrical assembly 102 includes one or more low-profile PCB-mounted contactors 100/200. PCB-mounted contactor 100/200 each have an orthogonal dimension D, defined in a direction orthogonal to a surface 124 of PCB 112, sized to prevent PCB-mounted contactor 100/200 from overlapping PCB slots adjacent to the respective PCB-mounted contactor 100/200. In the illustrated exemplary embodiment electrical assembly 102 includes one or more PCB-mounted contactor 100 mounting a linear contactor 114 with a plunger 150, one or more PCB-mounted contactor 200 mounting a pivot contactor 202, and one or more PCB assemblies 22 without contactors mounted in chassis 104. As will be appreciated by those of skill in the art in view of the present disclosure, electrical assembles can have smaller numbers or greater numbers of PCB-mounted contactor 100 and PCB-mounted contactor 200, as suitable for an intended application.

Figure 3:
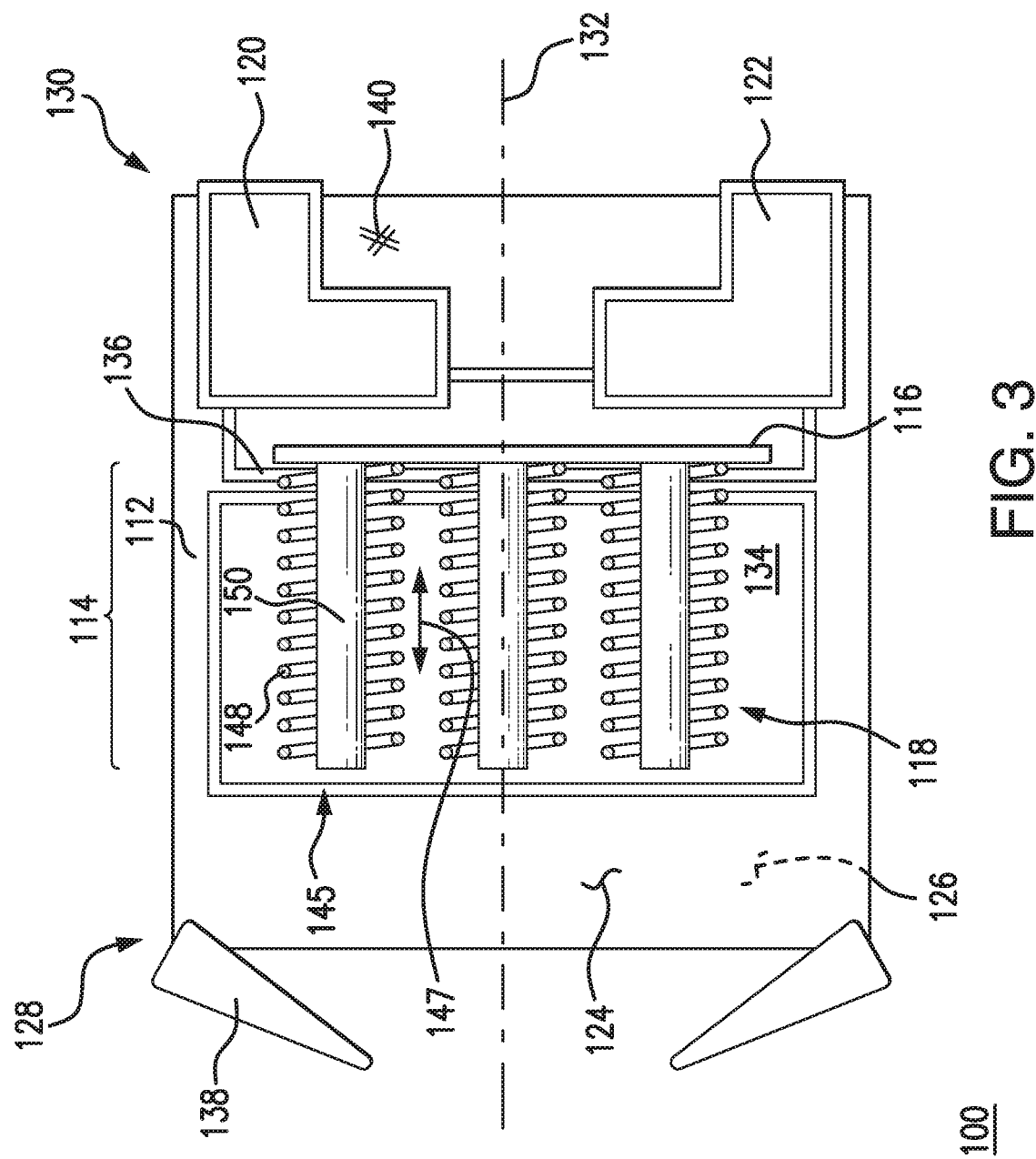
FIG. 3 is a plan view of the PCB-mounted contactor of FIG. 1 according to a first exemplary embodiment, showing a linear actuator operably connected to a contact.

With reference to FIG. 3, PCB-mounted contactor 100 is shown. PCB-mounted contactor 100 as arranged to be seated within electrical assembly 102 (shown in FIG. 1) and includes a PCB 112, a supply terminal 120, a load terminal 122, and linear contactor 114. Supply terminal 120 is electrically connected to generator 12 (shown in FIG. 1) through card cage 110 (shown in FIG. 2), or another source of alternating current or direct current power. Load terminal 122 is electrically connected to power-consuming device 16 (shown in FIG. 1) through card cage 110. Linear contactor 114 includes a contact 116 and actuator 118, as will be described.

PCB 112 has a first surface 124, an opposite second surface 126, and extends between an inserter/extractor end 128 and an interface end 130. First surface 124 and second surface 126 are substantially planar and in the illustrated exemplary embodiment are parallel to one another. Between inserter/extractor end 128 and interface end 130 PCB 112 defines a longitudinal axis 132 and an actuator aperture 134. Actuator aperture 134 extends between first surface 124 and second surface 126. Longitudinal axis 132 extends through actuator aperture 134. An actuator rib 136 spans actuator aperture 134 for mounting linear contactor 114 to PCB 112. In the illustrated exemplary embodiment actuator rib 136 laterally spans actuator aperture 134 and is angled relative longitudinal axis 132, e.g., is oriented at 90-degree or oblique angle relative to longitudinal axis 132.

An inserter/extractor arrangement 138 is disposed on inserter/extractor end 128 of PCB 112. Inserter/extractor arrangement 138 is arranged for applying seating and unseating forces to PCB 112 for seating and unseating PCB 112 within a PCB slot, e.g., PCB slot 106 (shown in FIG. 2). As will be appreciated by those of skill in the art in view of the present disclosure, seating PCB 112 in PCB slot 106 electrically connects supply terminal 120 and load terminal 122 with power bus 14 (shown in FIG. 1) and therethrough with generator 12 and power-consuming device 16, respectively. As will also be appreciated by those of skill in the art in view of the present disclosure, unseating PCB 112 from PCB slot 106 electrically disconnects both supply terminal 120 and load terminal 122 from power bus 14 (shown in FIG. 1), and thereby from generator 12 and power-consuming device 16. As shown in FIG. 3 inserter/extractor arrangement 138 includes a pair of lever arms pivotably connected to laterally opposite corners of PCB 112. This is for illustration purpose only and is non-limiting. Those of skill in the art will appreciate that other types of inserter/extractor devices can be employed by PCB-mounted contactor 100 within the scope of the present disclosure, as suitable for an intended application.

Supply terminal 120 and load terminal 122 are arranged on interface end 130 of PCB 112 and extend longitudinally relative to actuator aperture 134. It is contemplated that PCB 112 be formed from an electrically insulative material 140 that electrically isolates supply terminal 120 from load terminal 122. Supply terminal 120 and load terminal 122 are formed from an electrically conductive material, such as copper or aluminum, and are arranged to electrically connect with card cage 110 on one end and receive contact 116 on a longitudinally opposite end. In certain embodiments either or both of supply terminal 120 and load terminal 122 include a connector/pin arrangement in electrical communication with a wiring trace defined within PCB 112.

Figure 4:
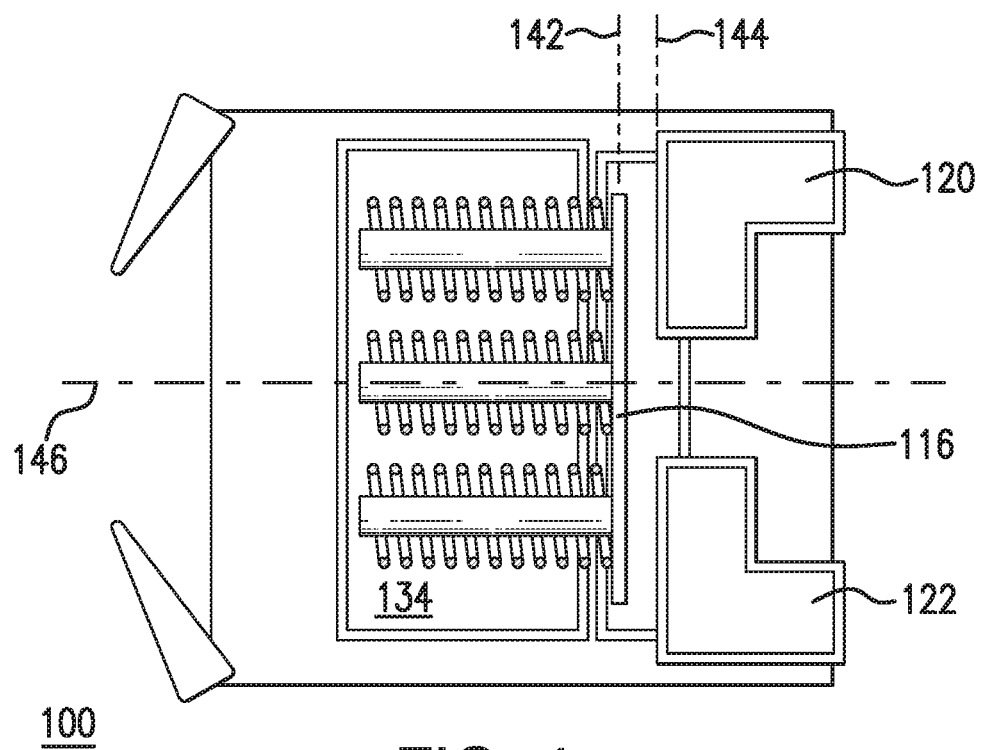
FIGS. 4 and 5 are plan views of the PCB-mounted contactor of FIG. 3, showing the contact in open and closed positions, respectively.
Figure 5:
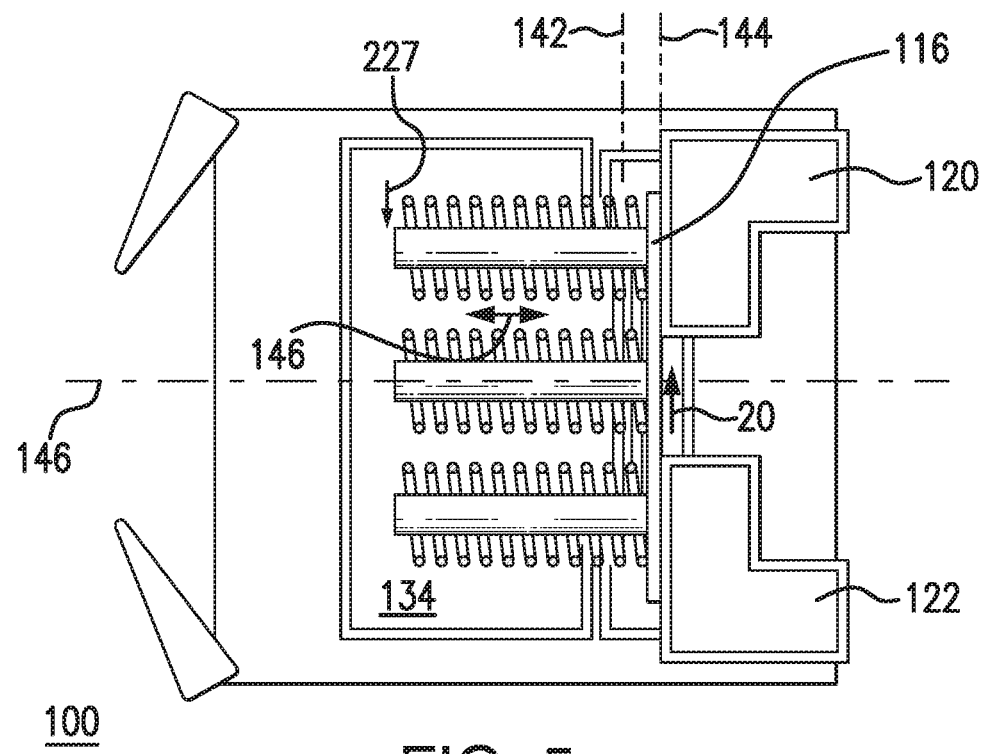

With reference to FIGS. 4 and 5, contact 116 is arranged within actuator aperture 134 and is arranged for movement being parallel to first surface 124. More particularly, movement of contact 116 between a closed position 144 and an open position 142 is parallel to first surface 124, open position 142 and closed position 144 being arranged along a movement axis 146. In certain embodiments movement axis 146 is parallel to PCB 112, e.g., is parallel with first surface 124 and second surface 126 of PCB 112. In accordance with certain embodiments, movement axis 146 is parallel to longitudinal axis 132 (shown in FIG. 3). Arranging movement axis 146 in parallel with second surface 126 such that contact 116 displaces in a linear movement 147 (shown in FIG. 5) reduces the height of PCB-mounted contactor 100, enabling PCB-mounted contactor 100 to be seated within a card rack, e.g., chassis 104 (shown in FIG. 2), without overlapping PCB slots adjacent to PCB-mounted contactor 100 when PCB-mounted contactor 100 is seated in a PCB slot.

In open position 142 (shown in FIG. 4), contact 116 is displaced from supply terminal 120 and load terminal 122. Displacement of contact 116 from supply terminal 120 and load terminal 122 electrically separates load terminal 122 from supply terminal 120. Being electrically separated, no electrical current flows from load terminal 122 to supply terminal 120. In the closed position 144 (shown in FIG. 5) contact 116 abuts supply terminal 120 and load terminal 122. Abutment of contact 116 against load terminal 122 and supply terminal 120 electrically connects load terminal 122 with supply terminal 120, enabling electric current 20 to flows from generator 12 (shown in FIG. 1) to power-consuming device 16 through PCB-mounted contactor 100. Closed position 144 and open position 142 are arranged along a movement axis 146, which is parallel with PCB 112.

It is contemplated that movement axis 146 be substantially parallel (coaxial) with longitudinal axis 132 of PCB 112. As will be appreciated by those of skill in the art in view of the present disclosure, arranging movement axis 146 in an orientation that is parallel with PCB 112 can reduce the height of PCB-mounted contactor 100 (height in the direction of the thickness of PCB 112), thereby allowing PCB-mounted contactor 100 to both mount linear contactor 114 and not overlap either (or both) adjacent PCB slot, e.g., PCB slot 108. As will also be appreciated by those of skill in the art in view of the present disclosure, this allows the adjacent PCB slots to be occupied by respective PCB assemblies, improving utilization of electrical assembly 102 (shown in FIG. 2).

With continuing reference to FIG. 3, actuator 118 is arranged to move contact 116 between closed position 144 (shown in FIG. 5) and open position 142 (shown in FIG. 4). More particularly, actuator 118 is operably connected to contact 116 and configured to displace contact 116 along movement axis 146 between closed position 144 and open position 142. In the illustrated exemplary embodiment actuator 118 includes a linear actuator, e.g., a solenoid 145. Solenoid 145 is arranged within actuator aperture 134 such that PCB 112 axially overlaps solenoid 145, reducing height of PCB-mounted contactor 100. Being arranged within actuator aperture 134, the orthogonal dimension D of PCB-mounted contactor 100 is independent of the thickness T of PCB 112.

Solenoid 145 includes a coil 148 and plunger 150. Plunger 150 is fixed relative to contact 116 and extends along movement axis 146. Coil 148 is fixed relative to PCB 112, extends about at least a longitudinal segment of plunger 150, and is arranged to receive an actuation current. The actuation current causes coil 148 to exert an electromotive force on plunger 150 directed along movement axis 146 (shown in FIG. 4) that causes contact 116 to move between open position 142 and closed position 144. It is contemplated that actuator 118 can include one or more solenoid 145, actuator 118 having three solenoids 145 in the illustrated exemplary embodiment. Having more than one solenoid allows for employment of coils 148 having smaller diameters than otherwise possible when a single coil is employed for a given force-generation requirement, allowing embodiments of PCB-mounted contactor 100 having more than one solenoid to have orthogonal dimensions D that are smaller than PCB-mounted contactors having a single solenoid.

In the illustrated exemplary embodiment, PCB-mounted contactor 100 includes more than one solenoid 145. Employment of more than one solenoid 145 allows for each of the plurality of solenoids to be diametrically smaller than the diameter of a single solenoid, further limiting height of PCB-mounted contactor 100, while generating force substantially equivalent of a single larger solenoid. In this respect disposing coil 148 within actuator aperture 134 renders orthogonal dimension D of PCB-mounted contactor 100 independent of PCB thickness T. Further, employment of plurality of coils 148 operably connected to contactor 116 allows orthogonal dimension D to smaller than a PCB-mounted contactor having a single coil 148 for a given force-generation requirement.

As will also be appreciated by those of skill in the art in view of the present disclosure, packaging linear contactor 114 is a vertical or flat arrangement as shown in FIG. 3 can improve heat dissipation and simplify thermal management within electrical system 10, reducing voltage drop and reducing the need to transfer heat to bus bars for cooling linear contactor 114. Optionally, heat transfer can be further improved by packaging linear contactor 114 as an open-frame contactor, i.e. without an intervening housing or cover separating contact 116 from the interior of electrical assembly 102 (shown in FIG. 1).

Figure 6:
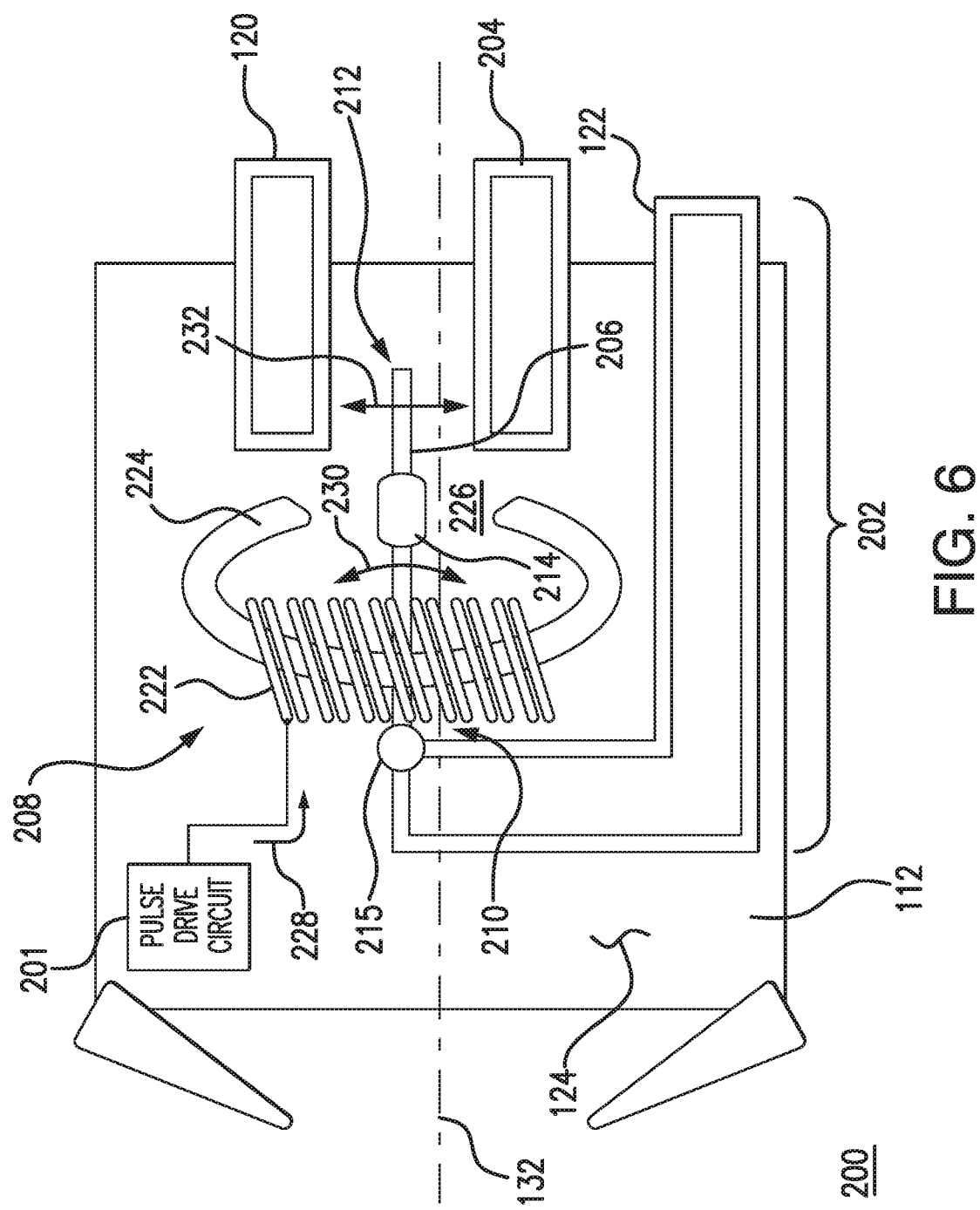
FIG. 6 is a plan view of the PCB-mounted contactor of FIG. 1 according to a second exemplary embodiment, showing a pivot actuator operably connected to a contact and the contact between open and closed positions.

With reference to FIG. 6, PCB-mounted contactor 200 according to a second embodiment is shown. PCB-mounted contactor 200 is similar to PCB-mounted contactor 100 (shown in FIG. 1) and additionally includes PCB-mounted pivot contactor 202. Pivot contactor 202 includes a stop terminal 204, a pivot contact 206, and a pivot actuator 208. Stop terminal 204 is fixed to PCB 112 at a location laterally interposed between supply terminal 120 and load terminal 122. Stop terminal 204 is electrically isolated from supply terminal 120 and load terminal 122.

Pivot contact 206 is formed from an electrically conductive material, such as copper or aluminum, and has a pivot end 210, a free end 212, and a permanent magnet 214. Pivot end 210 is pivotably fixed to a pivot 215. Pivot 215 electrically connects pivot contact 206 to load terminal 122. Free end 212 disposed on an end of pivot contact 206 opposite pivot 215 and is movable between an closed position 218 (shown in FIG. 7) and an open position 216 (shown in FIG. 8). Permanent magnet 214 is fixed relative to pivot contact 206 and is arranged along the length of pivot contact 206 between pivot end 210 and free end 212.

Pivot actuator 208 includes a pivot solenoid 220 configured to move pivot contact 206 along a movement arc 232 that is parallel to first surface 124. Pivot solenoid 220 has a coil 222 and a core 224. Core 224 is constructed from a ferromagnetic material such as ferrite, is seated within PCB 112 with opposite extends upward through first surface 124 of PCB 112 on opposite sides of pivot contact 206, and traces an arcuate segment interrupted by a gap 226. Coil 222 extends about the arcuate segment on a side longitudinally opposite gap 226. Pivot contact 206 extends through gap 226 such that permanent magnet 214 is arranged within gap 226.

Pivot solenoid 220 is configured to drive pivot contact 206 in a pivot motion 230 about pivot 215. During operation, i.e., closure and opening of PCB-mounted contactor 200, pivot motion 230 causes free end 212 to traverse movement arc 232 between open positon 216 (shown in FIG. 7) and closed position 218 (shown in FIG. 8). Movement arc 232 is parallel to first surface 124, reducing the height of PCB-mounted contactor 200 and enabling PCB-mounted contactor 200 to be seated within a card rack, e.g., chassis 104 (shown in FIG. 2), without overlapping adjacent PCB slots. In the illustrated exemplary embodiment movement arc is 232 oblique or substantially orthogonal to longitudinal axis 132 of PCB 112. It is contemplated that attraction between permanent magnet 214 and core 224 retain pivot actuator 208 in open position 216 (shown in FIG. 7) and closed position 218 (shown in FIG. 8) absent application of an actuation current 228, which operates to drive against the attraction force of the magnet in a sharp pulse for rapid switching transition between open position 216 and closed position 218. As will be appreciated by those of skill in the art in view of the present disclosure, the attraction force between permanent magnet 214 and core also accelerates the motion of pivot contact 206 during a state change, improving responsiveness of PCB-mounted contactor 200.

Figure 7:
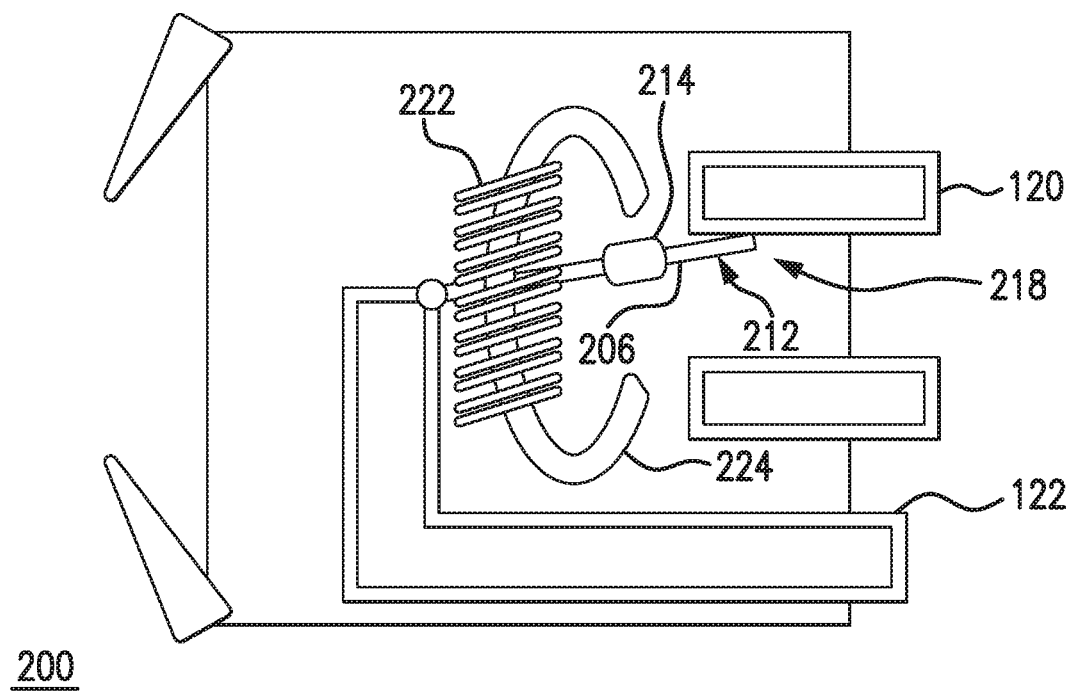
FIGS. 7 and 8 are plan views of the PCB-mounted contactor of FIG. 6, showing the contact in open and closed positions, respectively.
Figure 8:
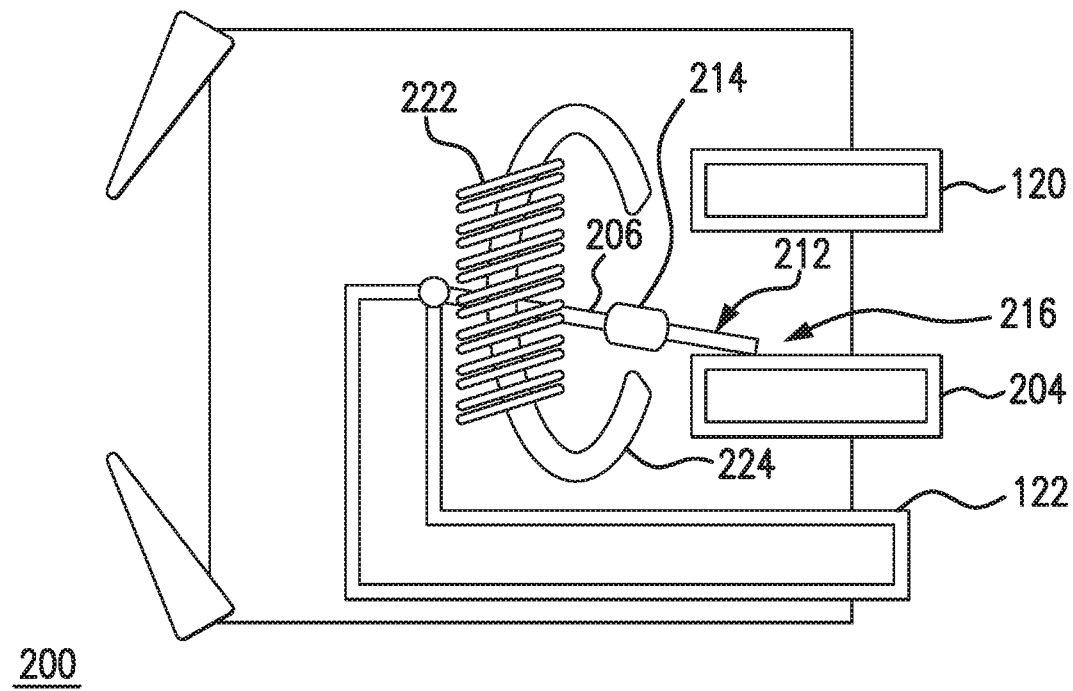

With reference to FIGS. 7 and 8, PCB-mounted contactor 200 is shown in the open and closed positions. When in closed position 218 (shown in FIG. 7) free end 212 of pivot contact 206 abuts supply terminal 120 and electrically connects load terminal 122 with supply terminal 120. This allows current 20 (shown in FIG. 1) to flow from generator 12 (shown in FIG. 1) to one or more of power-consuming devices 16 (shown in FIG. 1) through PCB-mounted contactor 200. When in open position 216 (shown in FIG. 8) pivot contact 206 abuts stop terminal 204. Abutment of free end 212 of pivot contact 206 against stop terminal 204 electrically disconnects supply terminal 120 from load terminal 122, ceasing current flow between load terminal 122 and supply terminal 120. As will be appreciated by those of skill in the art in view of the present disclosure, attractive force between permanent magnet 214 and core 224 operates to maintain contact between free end 212 of pivot contact 206 and supply terminal 120 or stop terminal 204, providing magnetic latching, and allowing for actuation current 228 to cease after application of a current pulse to coil 222. Actuation can be by way of pulse drive circuit 201 (shown in FIG. 6) electrically connected to pivot actuator 208 for moving pivot 206 between open position 216 (shown in FIG. 8) and closed position 218 (shown in FIG. 7). As will be appreciated by those of skill in the art, pulse drive circuit 201 can cooperate with the magnetic latching provided by permanent magnet 214 (shown in FIG. 6) to limits heat generation from PCB-mounted contactor 200 as current flow can cease once magnetic latching occurs.

Figure 9:
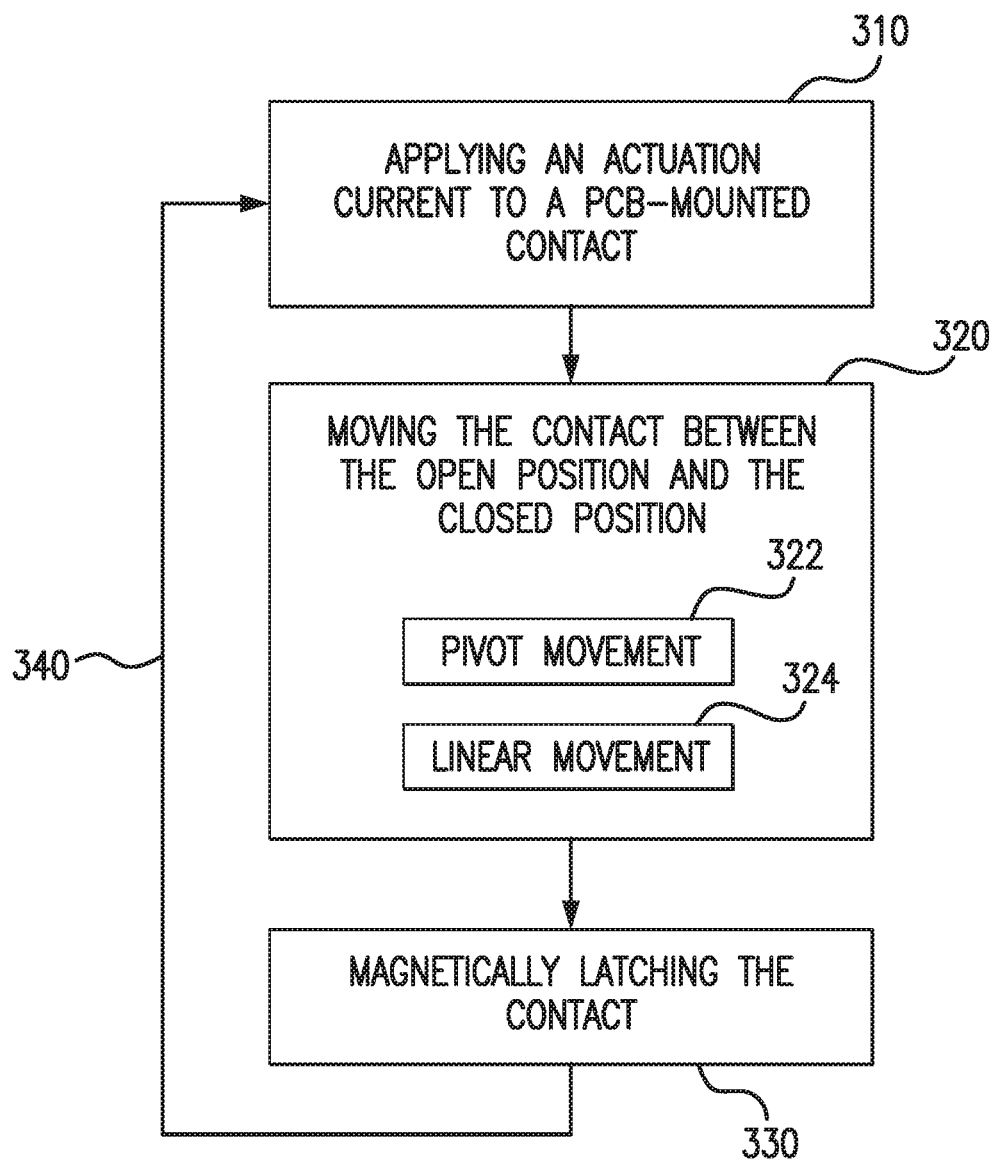
FIG. 9 is a block diagram of a method of actuating a PCB-mounted contactor, showing steps of the method.

With reference to FIG. 9, a method 300 of controlling current flow in an electrical system, e.g., electrical system 10 (shown in FIG. 1), including a PCB-mounted contactor, e.g., PCB-mounted contactor 100/200 (shown in FIG. 1), is shown. Method 300 includes applying an actuation current, e.g., actuation current 228 (shown in FIG. 6), to the PCB-mounted contactor, as shown with box 310. The actuation current moves a contact, e.g., contact 116 (shown in FIG. 3), between an open position, open position 142 (shown in FIG. 4), and a closed position, e.g., closed position 144 (shown in FIG. 4), as shown with box 320. It is contemplated that the movement be parallel with a surface of the PCB, e.g., second surface 126 (shown in FIG. 3). As shown with box 322, the movement can be a pivot movement, e.g., pivot movement 230 (shown in FIG. 6). As shown with box 324, the movement can be a linear movement, e.g., linear movement 147 (shown in FIG. 3). The actuation current can thereafter be removed from the contact and/or the contact move again between the open and closed positions, as shown with arrow 340. In certain embodiments the contact can be magnetically latched in the open or closed position, as shown with box 330, latching working differently in PCB-mounted contactor 100 (having a linear movement) than in PCB-mounted contactor 200 (having a pivot movement).

Traditional contactors can be bulky and/or relatively tall, creating challenges to packaging the contactors with PCBs in card cages. Traditional contactors can also be relatively slow (e.g., more than about ten milliseconds), particularly when the contactor is relatively large (e.g., more than an inch in height). In embodiments described herein low-profile contactors are provided. In certain embodiments the contactor has a planar arrangement with a contact that moves parallel with the surface of the PCB. In accordance with certain embodiments the contactor can include a permanent magnet, fixed relative to the contact, for enhancing the magnetic force applied via the core and coil in a reversible magnetic field. In further embodiments the permanent magnet can provide magnetic latching. It is also contemplated that, in accordance with certain embodiments, contactors can have a plurality of solenoids arranged in an array of coils and cores parallel with the surface of the PCB. The array of coils and cores can increase the force applied to the contact, reducing the time required to move the contact between the open and closed positions.

The methods and systems of the present disclosure, as described above and shown in the drawings, provide for PCB-mounted contactors with superior properties including 'slim' packaging for installation in card racks or other electrical assemblies, where size of a conventional contactor could otherwise exceed the pitch of the PCB slots in the card rack and reduce the number of PCBs that can seat in the card rack. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A printed circuit board (PCB) mounted contactor, comprising:
   a PCB with a planar surface;
   a supply terminal and a load terminal fixed to the PCB; and
   a contact supported by the PCB and movable between an open position and a closed position, movement of the contact being parallel to the planar surface of the PCB,
   wherein the open position of the contact and the closed position of the contact are in the same plane as the planar surface of the PCB, and wherein the contact is in contact with the supply terminal and the load terminal in at least one position.

2. The PCB-mounted contactor as recited in claim 1, wherein the supply terminal and the load terminal are arranged on an interface end of the PCB, and further comprising an inserter/extractor arranged on an end of the PCB opposite the supply terminal and load terminal.

3. The PCB-mounted contactor as recited in claim 1, further comprising an stop terminal arranged on the PCB between the supply terminal and the load terminal.

4. The PCB-mounted contactor as recited in claim 1, wherein the movement axis is parallel to a longitudinal axis of the PCB.

5. The PCB-mounted contactor as recited in claim 1, wherein the movement axis is orthogonal or oblique relative to a longitudinal axis defined by the PCB.

6. The PCB-mounted contactor as recited in claim 1, further comprising an pivot actuator supported by the PCB and operably connected to the contact.

7. The PCB-mounted contactor as recited in claim 6, wherein the pivot actuator comprises:
   a coil fixed relative to the PCB;
   a core extending through the coil and fixed to the PCB; and
   a permanent magnet fixed to the contact between opposite ends of the contact.

8. The PCB-mounted contactor as recited in claim 7, further comprising a pivot supporting an end of the contact, the pivot electrically connecting the contact to the load terminal, a pulse drive circuit being electrically connected to the pivot actuator.

9. The PCB-mounted contactor as recited in claim 1, further comprising a linear actuator operably connected to the contact.

10. The PCB-mounted contactor as recited in claim 9, wherein the linear actuator includes a solenoid with a coil, fixed relative to the PCB, and a plunger, fixed relative to the contact and extending through the coil.

11. The PCB-mounted contactor as recited in claim 10, wherein the solenoid is a first a solenoid and further comprising at least one second solenoid operably connected to the contact.

12. The PCB-mounted contactor as recited in claim 1, wherein the PCB defines an actuator aperture extending between opposite surfaces of the PCB, the contact open position and the closed position being disposed within the actuator aperture.

13. The PCB-mounted contactor as recited in claim 12, further comprising a coil disposed within the aperture such that an orthogonal dimension of the contactor is independent of thickness of the PCB.

14. The PCB mounted contactor as recited in claim 1, further comprising a plurality of coils operably connected to the contactor such that, for an equivalent amount of force, an orthogonal dimension of the contactor is smaller than a PCB-mounted contactor having a single coil.

15. An electrical assembly, comprising:
   a chassis having a first PCB slot and at least one adjacent second PCB slot; and
   a PCB-mounted contactor as recited in claim 1 seated in the first PCB slot, wherein the PCB-mounted contactor does not overlap the at least one adjacent second PCB slot.

16. The electrical assembly as recited in claim 15, wherein the PCB defines an actuator aperture extending between opposite surfaces of the PCB, the contact open position and the closed position being disposed within the actuator aperture, and further comprising:
   a linear actuator operably connected to the contact and arranged within the actuator aperture.

17. The electrical assembly as recited in claim 15, further comprising an pivot actuator supported by the PCB and operably connected to the contact, the pivot actuator comprising:
   a coil fixed relative to the PCB;
   a core extending through the coil and fixed to the PCB;
   a permanent magnet fixed to the contact between opposite ends of the contact; and
   a pivot supporting an end of the contact, the pivot electrically connecting the contact to the load terminal.

18. A method of controlling current flow in an electrical system, comprising:
   at a printed circuit board (PCB)-mounted contactor including a PCB with a planar surface, a supply terminal and a load terminal fixed to the PCB, and a contact supported by the PCB and movable between an open position and a closed position in a movement parallel with the PCB surface,
   applying an actuation current to the PCB-mounted contactor; and
   moving the contact between the open position and the closed position in a movement that is parallel the PCB surface, wherein the open position of the contact and the closed position of the contact are in the same plane as the planar surface of the PCB, and wherein the contact is in contact with the supply terminal and the load terminal in at least one position.

19. The method as recited in claim 18, wherein moving the contact between the open and closed positions includes pivoting the contact in a pivot movement between the open and closed positions such a free end of the contact traverses a movement arc, the method further comprising magnetically latching the contact.

20. The method as recited in claim 18, wherein moving the contact between the open and closed positions includes linearly displacing the contact between the open and closed positions such that contact traverses the movement axis.

* * * * *